United States Patent [19]

Sun

[11] 4,146,913
[45] Mar. 27, 1979

[54] SYMMETRICAL COMPONENT SEQUENCE FILTER

[75] Inventor: Shan C. Sun, Bell Township, Westmoreland County, Pa.

[73] Assignee: Westinghouse Electric Corp., Pittsburgh, Pa.

[21] Appl. No.: 866,152

[22] Filed: Dec. 30, 1977

[51] Int. Cl.² ............................................. H02H 3/26
[52] U.S. Cl. ..................................... 361/76; 324/108; 340/658; 340/658
[58] Field of Search .......................... 361/76; 324/108; 307/127

[56] References Cited

U.S. PATENT DOCUMENTS

| | | | |
|---|---|---|---|
| 2,854,632 | 9/1958 | Lode | 324/108 |
| 2,897,407 | 7/1959 | Morris | 361/76 |
| 3,154,737 | 10/1964 | Hodges | 324/108 |
| 3,237,031 | 2/1966 | Yeates et al. | 307/149 |
| 3,699,441 | 10/1972 | Linders | 324/108 X |
| 3,736,470 | 5/1973 | Ford et al. | 361/76 |
| 3,938,006 | 2/1976 | Gadwal et al. | 361/46 |
| 3,947,728 | 3/1976 | Smith | 361/76 |
| 3,992,651 | 11/1976 | Hodges | 361/76 |
| 4,023,075 | 5/1977 | Reuter | 361/76 |

Primary Examiner—Harry E. Moose, Jr.
Attorney, Agent, or Firm—D. R. Lackey

[57] ABSTRACT

A symmetrical component sequence filter which provides a signal responsive to a predetermined sequence quantity of an electrical power system, while using only one phase shift other than 180 degrees. A single reactive element provides the phase shift. A single adjustable resistor calibrates the filter when the reactive element is non-precision. Selecting a precision reactive element eliminates even the single adjustment. The symmetrical component sequence filter enables both a positive and a negative sequence component to be simultaneously derived from common processing circuitry, requiring only one additional reactive element.

20 Claims, 11 Drawing Figures

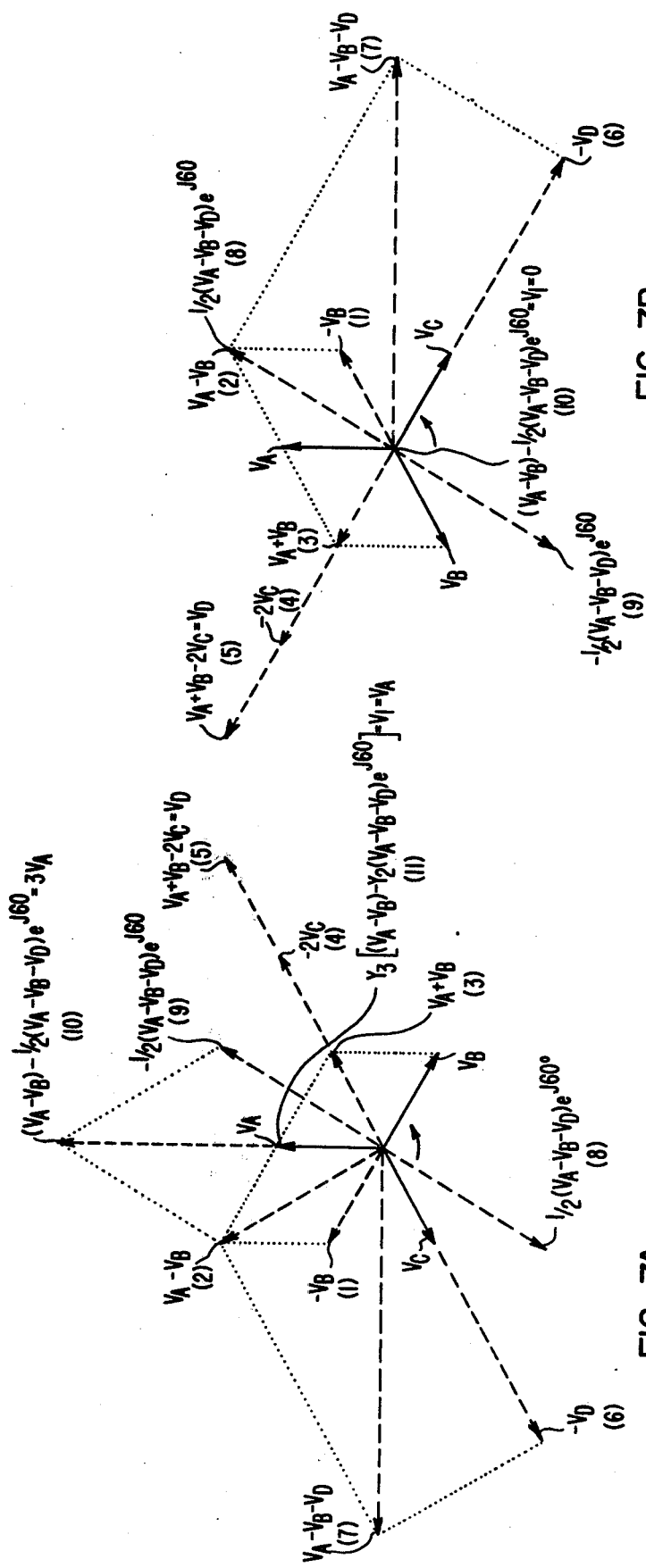

SYMMETRICAL COMPONENT SEQUENCE FILTER

BACKGROUND OF THE INVENTION

1. Field of the Invention

The invention relates to new and improved symmetrical component filters for deriving signals responsive to sequence quantities of a three-phase electrical power system.

2. Description of the Prior Art

The method of symmetrical components is a valuable engineering tool for the relay engineer, and is directly responsible for the conception of many protective relays and circuits in common usage today. The use of positive sequence alone is not very selective between faults and normal loads and swings. The use of negative sequence alone would not protect against three-phase faults. The use of zero sequence alone would not protect for all phase faults. Thus, while certain types of protective relays require only a single sequence quantity, others utilize two or all three of the symmetrical components to provide improved sensitivity and operation for all types of faults.

In order for the protective relays based on symmetrical components to operate, it must receive signals responsive to the required sequence, or sequences. Sequence filters provide these signals. Since the zero sequence quantities are all in phase with each other, the zero sequence filter does not require timing components. Thus, the zero sequence filters, for either current or voltage, are easily constructed of current or voltage transformers. In practice, the zero sequence signals are obtained from the current and/or voltage transformers already required for obtaining phase-related signals from the electrical power system for other purposes. Thus, signals responsive to the zero sequence are obtained for little or no additional cost.

Positive and negative sequence filters, on the other hand, have a 120 degree phase shift with respect to each other, and this time significance adds greatly to their complexity and cost. Positive and negative sequence filters are usually constructed of reactors, auto transformers, transformers, resistors, or capacitors, and they are thus bulky and costly. Active sequence filter networks using operational amplifiers have been developed in an attempt to reduce the size and cost of the positive and negative sequence filters. The translation of the functions performed by passive elements into active sequence filters, however, has resulted in many disadvantages. For example, certain of the prior art filters require interrelated adjustments to be performed, requiring tedious calibration since changing one setting affects the other. Odd ratios between the input signals are often required to be developed in order to achieve the phase shifts required by the specific implementation of the filter. Positive and negative sequence current filters of the active type may also reproduce the zero sequence in the output signal, unless the zero sequence current is removed from the signals before they are applied to the active filter; or, the active filter must contain special circuitry in order to cancel the zero sequence component.

Further, when discrete or separate positive and negative sequence signals are both required, a completely separate filter is used for each signal. This is true for both the passive and active sequence filters.

It would be desirable to reduce the cost of positive and negative symmetrical component sequence filters, without incurring the offsetting disadvantages of difficult calibration. It would also be desirable to be able to provide a sequence current filter which rejects any zero sequence component in the input signal without requiring additional circuitry specifically to deal with the zero sequence component. It would also be desirable to reduce the cost of positive and negative symmetrical component sequence filters when both are required by utilizing certain of the processing circuitry in common. It would also be desirable to reduce the cost of positive and negative sequence filters by reducing the number of reactive elements and the number of phase shifts utilized, other than 180 phase shifts which are easily performable by transformers or operational amplifiers. Finally, it would be desirable to reduce the cost of positive and negative sequence filters by eliminating the requirement of developing odd decimal relationships between the phase-related input signals.

SUMMARY OF THE INVENTION

Briefly, the present invention is a new and improved symmetrical component sequence filter which processes three signals responsive to the three phases of an electrical power system to provide first and second phasor signals. The only phase shifting required in the processing circuitry is a sign change, i.e., a 180 degree phase shift easily achievable by operational amplifier, or by a transformer. The first and second phasor signals are universally applicable to both the positive and negative sequence. The first and second phasor signals are combined in an appropriate phase shift circuit, having a single reactive component, with the nature of the phase shift circuit determining whether or not the filter is a positive sequence filter, or a negative sequence filter. Two phase shift circuits each having a single reactive component may be used to provide discrete signals responsive to both the positive sequence component, and a negative sequence component of the electrical power systems, with both phase shift circuits being responsive to the same first and second phasor signals. Only a single adjustable resistor is required per phase shift circuit, to provide quick, accurate calibration of the phase shift circuit when a non-precision reactive element is used. Use of a precision reactive element eliminates even this single adjustment. The positive sequence current filter provides a pure positive sequence signal, inherently rejecting both negative and zero sequence components without any specific circuitry to cancel the zero sequence component. In like manner, the negative sequence current filter also provides a pure negative sequence signal without special circuitry for cancelling any zero sequence component.

BRIEF DESCRIPTION OF THE DRAWING

The invention may be better understood, and further advantages and uses thereof more readily apparent, when considered in view of the following detailed description of exemplary embodiments, taken with the accompanying drawings in which:

FIGS. 7A, 7B and 7C are vector diagrams illustrating the operation of the positive sequence filter of the invention with positive, negative and zero sequence inputs, respectively.

DESCRIPTION OF PREFERRED EMBODIMENTS

Figure 1:
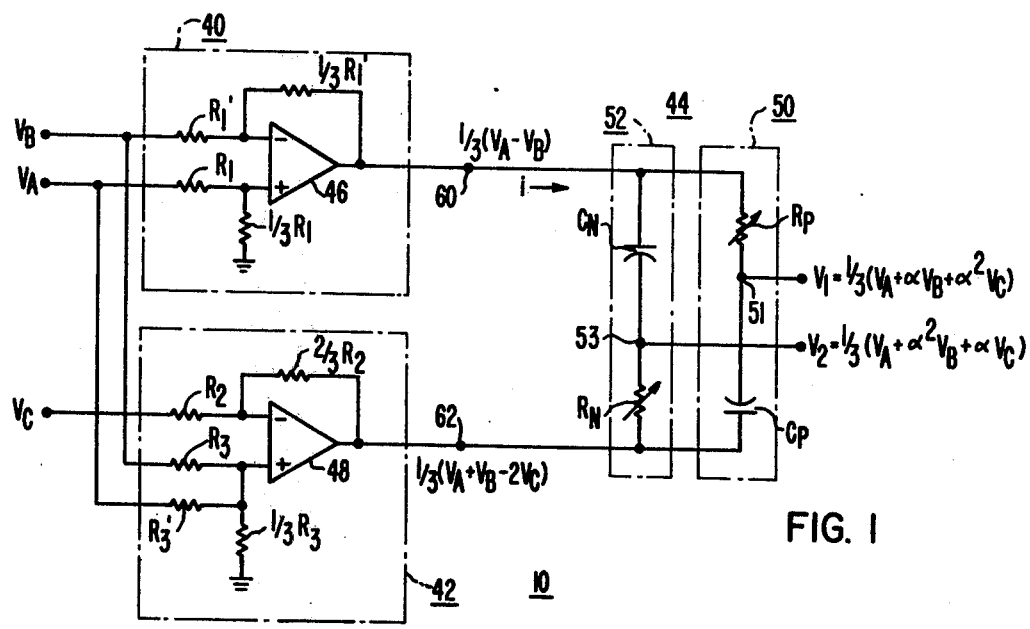
FIG. 1 is a schematic diagram of a sequence filter constructed according to the teachings of the invention.
Figure 2:
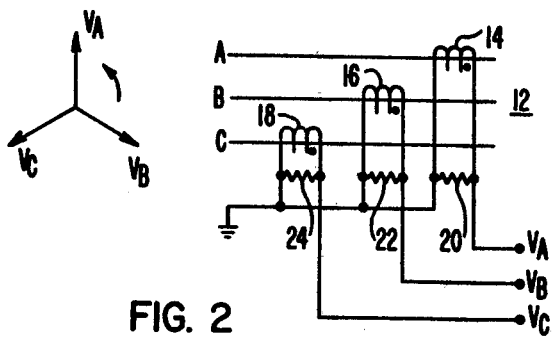
FIGS. 2 and 3 are schematic diagrams illustrating arrangements which may be used to provide current and voltage-related signals, respectively, for the sequence filter of FIG. 1, from a three-phase electrical power system.
Figure 3:
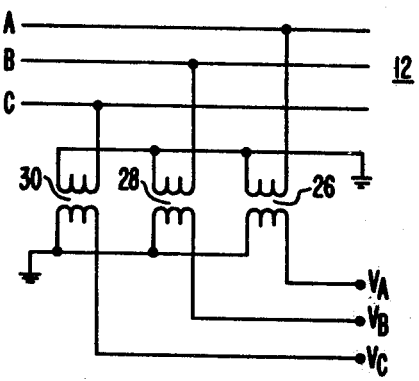

Referring now to the drawings, and to FIGS. 1, 2 and 3 in particular, there is shown a new and improved positive and/or negative sequence filter 10 constructed according to the teachings of the invention. Sequence filter 10 is responsive to three signals $V_A$, $V_B$ and $V_C$ which are derived from the three phases of a three-phase electrical power system. If sequence filter 10 is a sequence current filter, signals $V_A$, $V_B$ and $V_C$ may be derived as illustrated in FIG. 2. FIG. 2 illustrates a three-phase electrical power system 12 having line conductors A, B and C. The vector relationship of the three phases is as illustrated in FIG. 2. Three current transformers 14, 16 and 18 provide three current related voltage signals $V_A$, $V_B$, and $V_C$ across resistors 20, 22 and 24, respectively. If sequence filter 10 is a sequence voltage filter, signals $V_A$, $V_B$ and $V_C$ may be derived as illustrated in FIG. 3. Three potential transformers 26, 28 and 30 provide three line voltage related voltage signals $V_A$, $V_B$ and $V_C$. Thus, the following description of the positive and/or negative sequence filter 10 shown in FIG. 1 applies equally to the use of the filter as a voltage or a current sequence filter.

Filter 10 accepts the three phase-related signals $V_A$, $V_B$ and $V_C$ without regard to whether or not these signals contain a zero sequence component. In other words, it is unnecessary to provide apparatus for removing any zero sequence component from the signals before applying them to the filter 10. The zero sequence component is inherently cancelled in the filter 10, as will be hereinafter explained. Further, the cancellation occurs in the filter 10 without the necessity of providing special apparatus to develop a signal responsive to the zero sequence, and then adding still additional circuitry to cancel it.

Filter 10 includes three basic sections, first and second universal input sections 40 and 42, and an output section 44. The first input section 40 provides a first phasor signal responsive to a predetermined vector summation of any two of the three phase-related input signals. In FIG. 1, input signals $V_A$ and $V_B$ are selected for purposes of example. The first phasor signal is ($\frac{1}{2}$) $(V_A - V_B)$. It will be noted that this vector summation requires only a sign change of quantity $V_B$, i.e., a 180 degree phase shift, which may be easily provided by the operational amplifier 46 illustrated, or by a transformer. Signals $V_A$ and $V_B$ are applied to the non-inverting and inverting inputs of operational amplifier 46 via like valued resistors $R_1$ and $R_1'$, respectively. The non-inverting input is also connected to ground via a resistor ($\frac{1}{2}$) $R_1$, and the output of the operational amplifier 46 is connected back to the inverting input via a feedback resistor ($\frac{1}{2}$) $R_1'$. Thus, the operational amplifier 46 provides a signal ($\frac{1}{2}$) $(V_A - V_B)$ at an output terminal 60, which as hereinbefore stated is referred to as the first phasor signal.

The second input section provides a second phasor signal responsive to a predetermined vector summation of all three of the phase-related input signals. The predetermined vector summation sums the same two input signals selected for the first input section 40, and it doubles the magnitude of the remaining input signal and changes its sign. It will be noted that this vector summation may be easily provided by the operational amplifier 48 illustrated, or by a transformer. Signals $V_A$ and $V_B$ are applied to the non-inverting input of operational amplifier 48 via resistors $R_3$ and $R_3'$, respectively, and signal $V_C$ is applied to the inverting input of operational amplifier 48 via a resistor $R_2$. The non-inverting input is connected to ground via a resistor ($\frac{1}{2}$) $R_3$, and the output of operational amplifier 48 is connected back to the inverting input via a resistor ($\frac{2}{3}$) $R_2$. Thus, operational amplifier 48 provides a signal ($\frac{1}{2}$) $(V_A + V_B - 2V_C)$ at an output terminal 62, which as hereinbefore stated is referred to as the second phasor signal.

I have found that these easily achievable relationships defined by the first and second phasor signals are basic or universal to both the positive and negative sequence. Thus, when it is desired to provide discrete signals responsive to both the positive and negative sequence, it is not necessary to provide two complete, essentially duplicate filter arrangements, which differ only in that the inputs from phases B and C are reversed. The output section 44 illustrates this versatility. If signals responsive to both the positive and negative sequence components are desired, the output section 44 includes a first phase shift circuit 50 for providing a signal $V_1$ at an output terminal 51 responsive to the positive sequence quantity ($\frac{1}{3}$) $(V_A + aV_B + a^2V_C)$, and a second phase shift circuit 52 for providing a signal $V_2$ at an output terminal 53 responsive to the negative sequence quantity ($\frac{1}{3}$) $(V_A + a^2V_B + aV_C)$. If filter 10 is only to be used to provide the positive sequence component, only phase shift circuit 50 would be provided. If filter 10 is to be used to provide only the negative sequence, only phase shift circuit 52 would be provided.

I have further found that depending upon the two phases initially selected for the first input section, that the phase shift circuits 50 and 52 will be required to provide the easily achievable phase shift magnitudes of 30 degrees, or 60 degrees. For example, when the B and C phases are selected, as illustrated, phase shift circuits 50 and 52 provide 60-degree lead and 60-degree lag, respectively.

It will be noted that phase shift circuit 50 includes a single reactive element, i.e., a capacitor $C_P$, and a single resistive element $R_P$. Resistor $R_P$ and capacitor $C_P$ are serially connected between output terminals 60 and 62, in the recited order, with the output signal $V_1$ being provided at their junction 51. Resistor $R_P$ is illustrated as being adjustable, which enables a lower cost, non-precision reactive element to be used. Calibration via resistor $R_P$ is quick and accurate, changing only the phase angle without affecting gain. Calibration only requires the application of a known negative sequence signal to the filter 10, with resistor $R_P$ being adjusted until the output signal $V_1$ is equal to zero. This single adjustment may be eliminated, if desired, by providing a precision reactive element, and a precision resistive element, i.e., ±1%.

Phase shift circuit 52 is similar to phase shift circuit 50, requiring only a single reactive element, i.e., such as a capacitor $C_N$, and a single resistive element $R_N$. Capacitor $C_N$ and resistor $R_N$ are serially connected between output terminals 60 and 62, in the recited order, with the output signal $V_2$ being provided at their junction 53.

The values of the capacitor and resistor used in phase shift circuit 50 are determined from the following relationship:

$$1/\sqrt{3} = 2\pi f C_P R_P \quad (1)$$

selecting an economical value for $C_P$, equation (1) may be solved for $R_P$ to provide:

$$R_P = 1/(\sqrt{3}\, 2\pi f C_P) \quad (2)$$

The values of the capacitor and resistor used in phase shift circuit 52 are determined from the relationship:

$$\sqrt{3} = 2\pi f C_N R_N \quad (3)$$

Selecting an economical value for $C_N$, the equation (3) may be solved for $R_N$ to provide:

$$R_N = \sqrt{3}/(2\pi f C_N) \quad (4)$$

The relationships set forth in (1) and (3) are necessary in order to satisfy the design philosophy that the universal input sections 40 and 42 have no phase shifts other than a sign change, and that the phase shift circuits 50 and 52 have a phase shift requirement which may be easily achieved with a single, economical reactive element.

Figure 4:
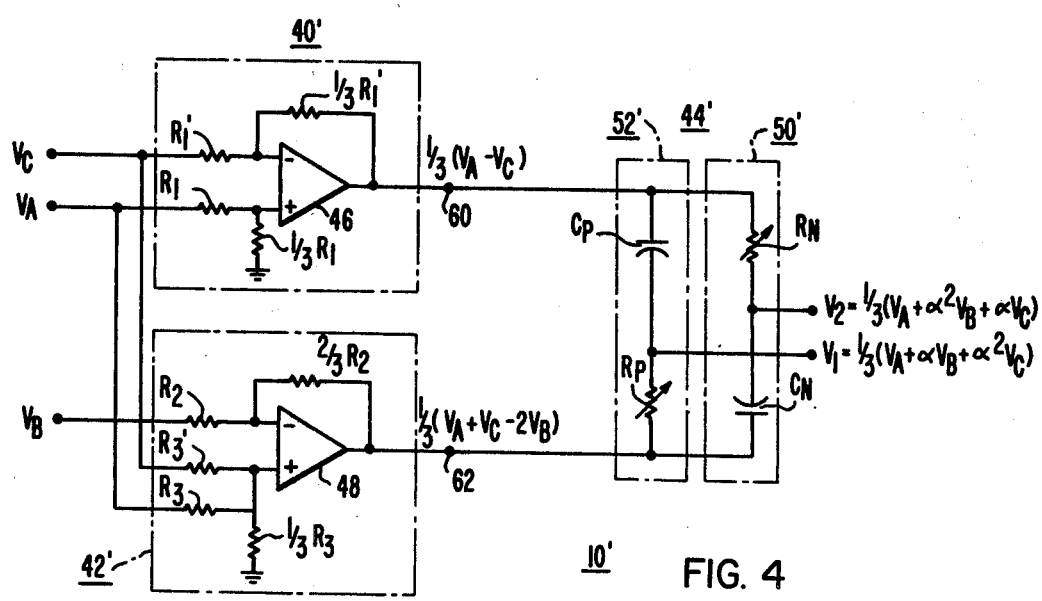
FIG. 4 is a schematic diagram of a sequence filter which is similar to the sequence filter of FIG. 1, except modified to illustrate a different initial arrangement of input signals.

FIG. 4 is a schematic diagram of a sequence filter 10' which is similar to filter 10 shown in FIG. 1 except input signals responsive to the B and C phases have been reversed. It will be noted that the phase shift network 50' now provides the negative sequence $V_2$, while the phase shift network 52' provides the positive sequence $V_1$, which is as expected, as it is fundamental to sequence filter design that the reversal of the B and C phases will change a filter from the positive sequence to the negative sequence, or vice versa.

Figure 5:
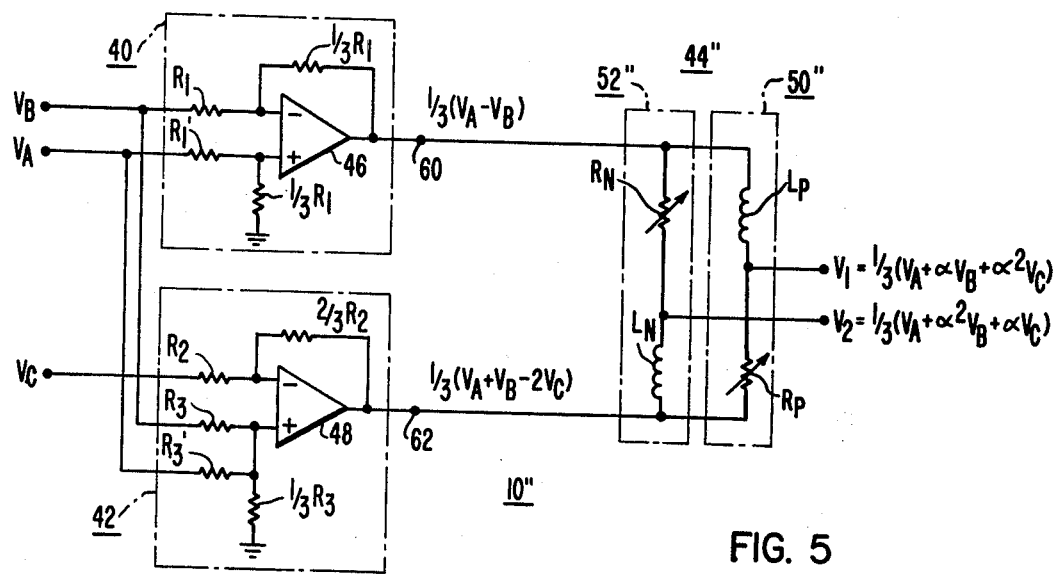
FIG. 5 is a schematic diagram of a sequence filter which is similar to the sequence filter shown in FIG. 1, except modified to illustrate that inductive reactive elements may be used in the phase shift circuits, instead of the capacitive elements shown in FIGS. 1 and 4.

FIG. 5 is a schematic diagram of a sequence filter 10'' which is similar to filter 10 shown in FIG. 1, except modified to illustrate that the reactive components of the phase shift networks may be inductive elements, rather than the capacitive elements illustrated in FIGS. 1 and 4. The positive sequence $V_1$ is provided by a phase shift circuit 50'' having an inductor $L_P$ and a resistor $R_P$ serially connected between terminals 60 and 62 in the recited order, with the positive sequence $V_1$ being provided at their junction. The negative sequence $V_2$ is provided by a phase shift circuit 52'' having a resistor $R_N$ and an inductor $L_N$ serially connected between terminals 60 and 62 in the recited order, with the negative sequence $V_2$ being provided at their junction.

Figure 6:
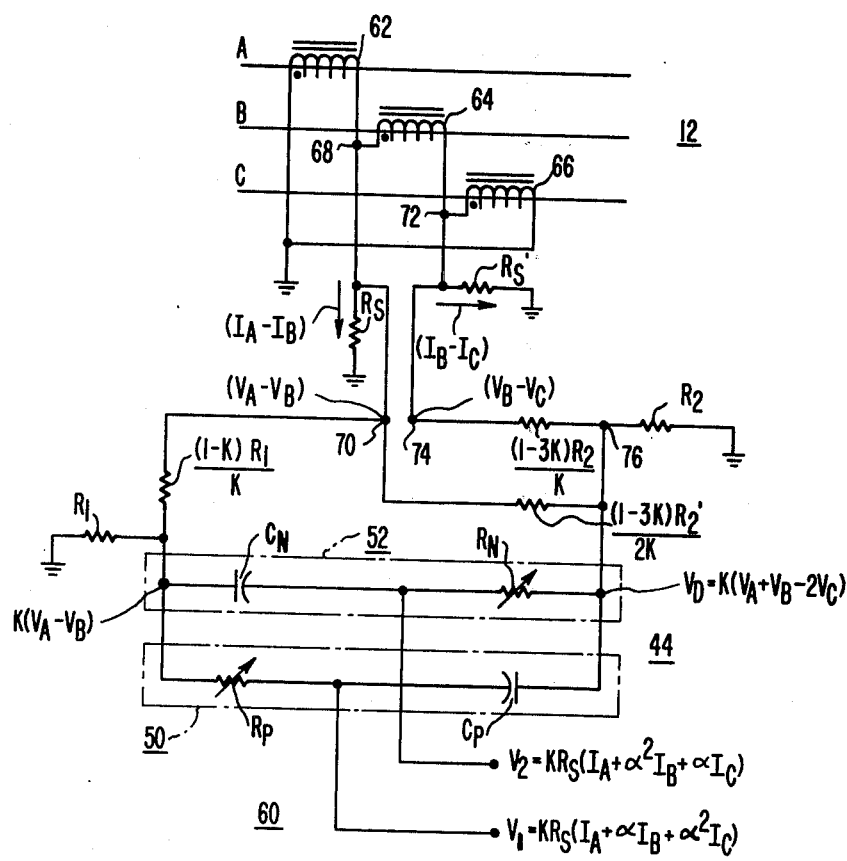
FIG. 6 is a schematic diagram of a current sequence filter constructed according to the teachings of the invention, illustrating that the concept of FIG. 1 applies equally to a filter having all passive elements, as well as to a filter having active elements, such as illustrated in FIGS. 1, 4 and 5.

FIG. 6 is a schematic diagram of a current sequence filter 60 illustrating first and second phasor signals K $(V_A - V_B)$ and K $(V_A + V_B - 2V_C)$, respectively, developed via all passive resistive elements.

More specifically, three current transformers 62, 64 and 66 provide current signals $I_A$, $I_B$ and $I_C$, respectively, responsive to the magnitude of the line currents in conductors A, B and C of the three-phase electrical power system 12. Current transformer 62 has its dotted end connected to ground, and its other end is connected to the dotted end of current transformer 64 at junction 68. Junction 68 is connected to ground via a resistor $R_S$. Thus, current $I_A - I_B$ flows through resistor $R_S$, providing a current related voltage signal $V_A - V_B$ across resistor $R_S$, which signal appears at terminal 70.

Current transformer 64 has its undotted end connected to the dotted end of current transformer 66 at junction 72. Junction 72 is connected to ground via a resistor $R_S'$. Thus, a current $I_B - I_C$ flows through resistor $R_S'$, providing a current related voltage signal equal to $V_B - V_C$ across resistor $R_S'$ which appears at terminal 74.

Signal $V_A - V_B$ is applied to output section 44, which may be the same as the output section 44 hereinbefore described related to FIG. 1, via a scaling voltage divider network which includes a resistor $[(1-K)R_1]/K$ and a resistor $R_1$ connected serially from terminal 70 to ground, in the recited order. The junction between these resistors provides a signal $K(V_A - V_B)$. Signal $K(V_A - V_B)$ corresponds to the first phasor signal ($\frac{1}{3}$) $(V_A - V_B)$ except the scaling is different, as will be hereinafter noted.

Signals $V_A - V_B$ and $V_B - V_C$ are combined and scaled in a resistive network which includes a resistor $[1-3K)R_2]/K$ and a resistor $R_2$ serially connected from terminal 74 to ground, in the recited order, with the junction of these two resistors being referenced 76. A resistor $[(1-3K)R_2']/K$ is also connected from terminal 70 to junction 76. The signal appearing at junction 76 is applied to output section 44. This signal is equal to $K(V_A + V_B - 2V_C)$ and is thus similar to the second phasor signal of FIG. 1, except for the scaling factor.

The output of phase shift circuit 50 provides the positive sequence signal $V_1 = KR_S(I_A + \alpha I_B + \alpha^2 I_C)$. In like manner, the output of phase shift circuit 52 provides the negative sequence signal $V_2 = KR_S(I_A + \alpha^2 I_B + \alpha I_C)$.

In selecting the values of the various resistive components, the ratio $R_1/K$ and the ratio $R_2/3K$ should be much greater than $R_S$. The values of $R_P$ and $R_N$ should be much greater than $(1-K)R_1$. The values of $R_P$ and $R_N$ should also be much greater than $(1-3K)R_2$. Finally, K should be less than $\frac{1}{3}$.

FIGS. 7A, 7B and 7C are vector diagrams which graphically prove that the filter 10 will operate as described. Referring first to FIG. 1, the portion $V_A + V_B - 2V_C$ of the second phasor signal will be referred to as $V_D$, and the scaling factor $\frac{1}{3}$ relative to both phasors will be ignored, for convenience. Now, taking one of the terminals 60 or 62, such as terminal 60, as a reference, and assuming the current i is flowing in the direction indicated in FIG. 1, the voltage appearing at junction 51, i.e., the positive sequence signal $V_1$, may be determined as follows:

$$i_1 = [(V_A - V_B), - V_D] / (R_P + \frac{1}{j\omega C_P}) \quad (5)$$

or

-continued
$$i_1 = [(V_A - V_B) - V_D] j\omega C_P / (R_P j\omega C_P + 1) \tag{6}$$

The voltage drop $V_X$ across resistor $R_P$ will thus be equal to:

$$V_X = iR_P = [(V_A - V_B) - V_D] j\omega C_P R_P / (R_P j\omega C_P + 1) \tag{7}$$

Thus, $$V_1 = (V_A - V_B) - V_X \tag{8}$$

or $$V_1 = (V_A - V_B) - [(V_A - V_B) - V_D] j\omega C_P R_P/(j\omega C_P R_P + 1) \tag{9}$$

The term $j\omega C_P R_P/(j\omega C_P R_P+1)$ may be simplified from equation (1), by setting $\omega C_P R_P = 1/\sqrt{3}$.
Thus, $$j\omega C_P R_P/j\omega C_P R_P + 1 = (\tfrac{1}{2} + [\sqrt{3}/2\, j]) \tag{10}$$

or $$(\tfrac{1}{2})e^{j60} \tag{11}$$

Thus, equation (9) may be written as:

$$V_1 = (V_A - V_B) - [(V_A - V_B) - V_D](\tfrac{1}{2})e^{j60} \tag{12}$$

Relationship (12) is used to prove the operability of filter 10 in FIGS. 7A, 7B and 7C. FIG. 7A graphically illustrates the operation of filter 10 used as a positive sequence filter, with a positive sequence input to the filter. The various steps in FIG. 7A are numbered to indicate a suitable order for combining the three signals $V_A$, $V_B$ and $V_C$.

FIG. 7A

| Step | Function |
|---|---|
| 1 | Change sign of $V_B$ to provide $-V_B$ |
| 2 | Sum $V_A$ and $-V_B$ to provide $V_A - V_B$ |
| 3 | Sum $V_A$ and $V_B$ to provide $V_A + V_B$ |
| 4 | Double the magnitude of $V_C$ and change its sign to provide $-2V_C$ |
| 5 | Combine $V_A + V_B$ from Step 3 with $-2V_C$ from Step 4 to provide $V_A + V_B - 2V_C$, which will now be called $V_D$ |
| 6 | Change the sign of $V_D$ to provide $-V_D$ |
| 7 | Combine $V_A - V_B$ from Step 2 with $-V_D$ from Step 6 to provide $V_A - V_B - V_D$ |
| 8 | Reduce the magnitude of $V_A - V_B - V_D$ from Step 6 by $\tfrac{1}{2}$ and shift it 60 degrees in the positive direction to provide $(\tfrac{1}{2})(V_A - V_B - V_D)e^{j60}$ |
| 9 | Change the sign of $\tfrac{1}{2}(V_A - V_B - V_D)e^{j60}$ to provide $-\tfrac{1}{2}(V_A - V_B - V_D)e^{j60}$ |
| 10 | Combine $V_A - V_B$ from Step 2 and $-\tfrac{1}{2}(V_A - V_B - V_D)e^{j60}$ from Step 9 to provide $(V_A - V_B) - \tfrac{1}{2}(V_A - V_B - V_D)e^{j60}$, which will be noted is equal to $3V_A$ |
| 11 | Applying the scaling factor $\tfrac{1}{3}$ to the result of Step 10 provides $\tfrac{1}{3}(V_A - V_B) - \tfrac{1}{3}(V_A - V_B - V_D)e^{j60} = V_A = V_1$. |

FIG. 7B illustrates the positive sequence filter with a negative sequence input. Note that the vectors of the negative sequence have the relationship $V_A$, $V_C$, $V_B$, instead of $V_A$, $V_B$, $V_C$ as in the positive sequence. When the same steps outlined relative to FIG. 7A are followed, it will be noted that $V_A - V_B$ developed in Step 2 is equal to and opposite in phase to $-\tfrac{1}{3}(V_A - V_B - V_D)e^{j60}$ developed in Step 9, and thus $V_1$ is equal to zero.

FIG. 7C illustrates the positive sequence filter with a zero sequence input. The vectors $V_A$, $V_B$ and $V_C$ will all be equal to one another and in-phase. Thus, the term $V_A - V_B$ will be equal to zero, and the term $V_A + V_B - 2V_C$ will be equal to zero, resulting in $V_1$ being equal to zero.

Using the procedure similar to that hereinbefore set forth, except applied to determine the voltage appearing at terminal 53 of FIG. 1, i.e., the negative sequence signal, the following relationship is derived:

$$V_2 = (V_A - V_B) - [(V_A - V_B) - V_D][1/(1 + j\omega C_N R_N)] \tag{13}$$

The term $1/(1 + j\omega C_N R_N)$ may be simplified from equation (3) by setting $C_N R_N = \sqrt{3}$.
Thus, $$1/(1 + j\omega C_N R_N) = \tfrac{1}{2}(\tfrac{1}{2} - (j\sqrt{3}/2)) \tag{14}$$

or, $$\tfrac{1}{2}e^{-j60} \tag{15}$$

and equation (13) may be written:

$$V_2 = (V_A - V_B) - (V_A - V_B - V_D)e^{-j60} \tag{16}$$

Relationship (16) is used to prove the operability of filter 10 as a negative sequence filter in FIGS. 7A and 7B. It will be observed that equations (12) and (16) are similar except for the phase shift and that a negative sequence input will thus produce a zero output since terms $V_A - V_B$ and $V_A - V_B - V_D$ will both be equal to zero. Thus, a graph for the negative sequence filter with a zero sequence input would be exactly the same as FIG. 7C, and accordingly, it is not repeated.

Figure 8B:
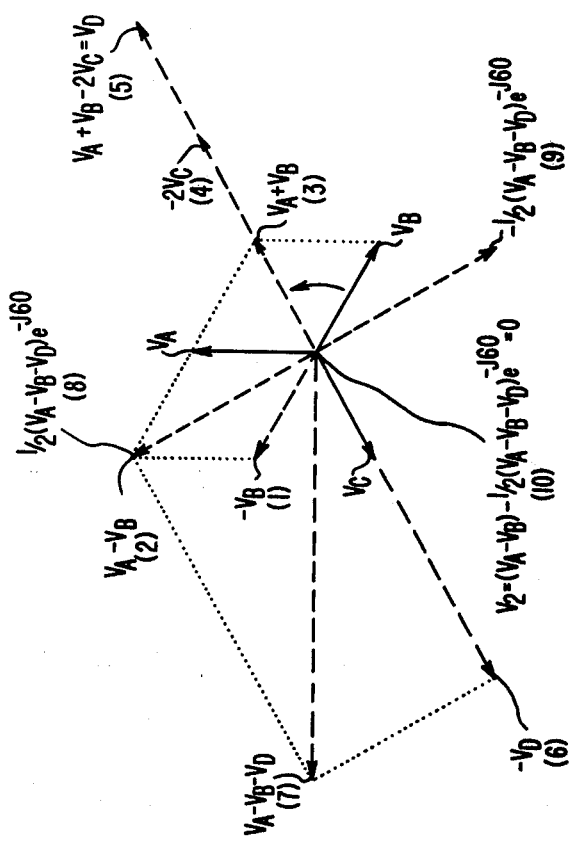
FIGS. 8A and 8B are vector diagrams illustrating the operation of the negative sequence filter of the invention with negative and positive sequence inputs, respectively.
Figure 8A:
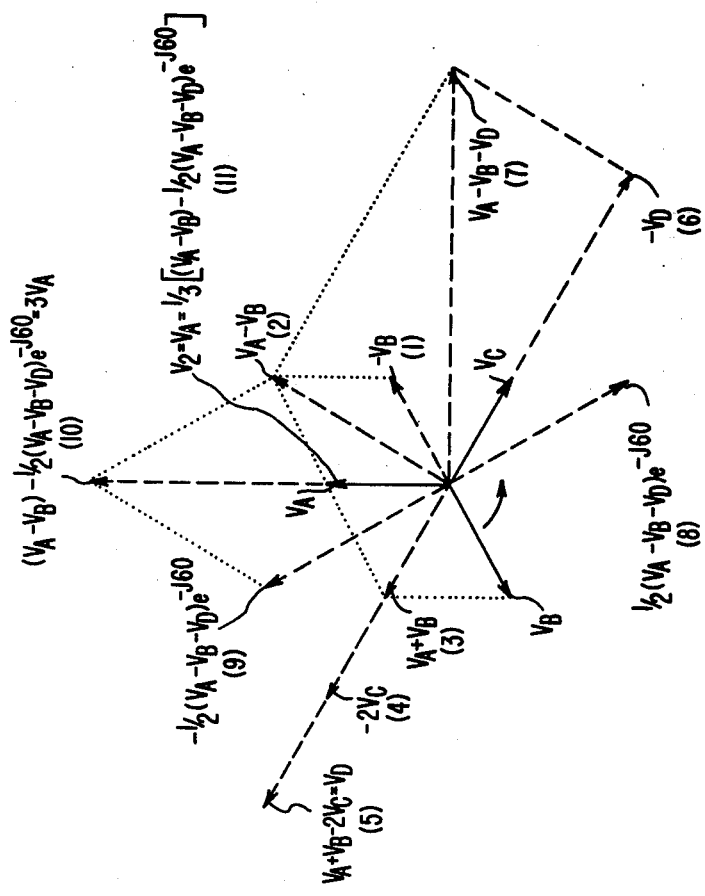

FIG. 8A graphically illustrates FIG. 10 as a negative sequence filter with a negative sequence input. Following the steps hereinbefore set forth relative to FIG. 7A, illustrates that $V_2$, the negative sequence component, is equal to $V_A$.

FIG. 8B graphically illustrates filter 10 as a negative sequence filter with a positive sequence input. FIG. 8B indicates that the negative sequence filter 10 rejects or cancels the positive sequence, as $V_2$ is equal to zero.

In summary, there has been disclosed new and improved symmetrical component sequence filters which may be constructed of non-precision components while requiring only a single easily and quickly performed adjustment. If desired, precision components may be utilized in the phase shift circuits, and even the single adjustment may be eliminated. Further, it has been shown that the new and improved sequence filters of the invention inherently reject any zero sequence component in the input signal without requiring additional circuitry. The new and improved sequence filters of the invention require only a single reactive element per sequence, and only a single phase shift, other than a 180 degree phase shift, is required per detected sequence. Still further, the scaling relationships required to be performed on the input signals are common values, which are easily performed with standard resistors and other circuit elements. Finally, the new and improved sequence filters utilize processing circuitry which is universally applicable to both the positive and negative sequence. The type of phase shift circuit connected to the processing circuitry determines whether the filter will be a positive sequence filter or a negative sequence filter; or, by using two phase shift circuits responsive to the same processing circuitry, the filter may provide discrete pure positive and negative sequence signals.

I claim as my invention:

1. A symmetrical component sequence filter for providing an output signal responsive to a predetermined sequence quantity of a three-phase electrical power system, comprising:

first means providing first, second and third signals responsive to the three phases of the electrical power system, second means providing a first phasor signal responsive to a predetermined vector summation of any two of said first, second and third signals, third means providing a second phasor signal responsive to a predetermined vector summation of all of said first, second and third signals, said first and second phasor signals being universally applicable to both the positive and negative sequence, and first phase shift means having inputs responsive to said first and second phasor signals, and an output providing a signal responsive to a first sequence quantity of the electrical power system, with the first phase shift means determining the nature of the first sequence quantity.

2. The symmetrical component sequence filter of claim 1 wherein the second means includes means providing a single phase shift of one of the selected signals provided by the first means, with the single phase shift being 180 degrees.

3. The symmetrical component sequence filter of claim 1 wherein the third means includes means providing a single phase shift of one of the signals provided by the first means, with the single phase shift being 180 degrees.

4. The symmetrical component sequence filter of claim 1 wherein the second means includes means providing a single phase shift of one of the selected signals provided by the first means, with the single phase shift being 180 degrees, and wherein the third means includes means providing a single phase shift of one of the signals provided by the first means, with the single phase shift being 180 degrees.

5. The symmetrical component sequence filter of claim 1 wherein the first phase shift means includes a single reactive element.

6. The symmetrical component sequence filter of claim 1 wherein the elements of the first phase shift means are precision elements, with only one of said precision elements being a reactive element.

7. The symmetrical component sequence filter of claim 1 wherein the first phase shift means includes a single non-precision reactive element, and adjustable resistor means, with said adjustable resistor means calibrating the phase shift means.

8. The symmetrical component sequence filter of claim 1 wherein the predetermined vector summation of the second means shifts one of the signals 180 degrees and adds it to the other, to provide the first phasor signal.

9. The symmetrical component sequence filter of claim 1 wherein the predetermined vector summation of the third means doubles the magnitude of the signal not used by the second means, shifts it 180 degrees, and adds it to the vector sum of the other two signals, to provide the second phasor signal.

10. The symmetrical component sequence filter of claim 1 wherein the predetermined vector summation of the second means shifts one of the signals 180 degrees and adds it to the other to provide the first phasor signal, and the predetermined vector summation of the third means doubles the magnitude of the signal not used by the second means, shifts it 180 degrees, and adds it to the vector sum of the other two signals, to provide the second phasor signal.

11. The symmetrical component sequence filter of claim 1 wherein the second and third means each include an active element.

12. The symmetrical component sequence filter of claim 1 wherein the first, second and third signals provided by the first means are related to the three line currents of the electrical power system, and the first and second means include all passive, resistive elements in developing the first and second phasor signals, respectively.

13. The symmetrical component sequence filter of claim 1 wherein the first filter means includes first and second input terminals, a resistive element and a reactive element connected between said first and second input terminals, and an output terminal at the junction between said resistive and reactive elements.

14. The symmetrical component sequence filter of claim 1 wherein the first filter means includes first and second input terminals, a resistive element and a reactive element serially connected between said first and second input terminals, with the first and second phasor signals each being applied to a selected different one of said first and second input terminals, and with the junction between the resistive and reactive elements providing the output signal.

15. The symmetrical component sequence filter of claim 1 wherein the first sequence quantity is a positive sequence component and including second filter means having inputs responsive to the first and second phasor signals, and an output providing a signal responsive to a negative sequence component of the electrical power system.

16. The symmetrical component sequence filter of claim 15 wherein the first and second phase shift means each include a single reactive element.

17. The symmetrical component sequence filter of claim 15 wherein the elements of the first and second phase shift means are all precision elements, with only one of the precision elements in each phase shift means being a reactive element.

18. The symmetrical component sequence filter of claim 15 wherein the first and second phase shift means each includes a single non-precision reactive element, and adjustable resistor means, with the adjustable resistor means calibrating the associated phase shift means.

19. The symmetrical component sequence filter of claim 15 wherein the first and second filter means each include first and second input terminals, a resistive element and a reactive element connected between said first and second input terminals, and an output terminal at the junction between the resistive and reactive elements.

20. The symmetrical component sequence filter of claim 15 wherein the first and second filter means each include first and second input terminals, a resistive element and a reactive element serially connected between said first and second input terminals, with the first and second phasor signals each being applied to a selected different one of said first and second input terminals, and with the junction between the resistive and reactive element in each filter providing an output signal.

* * * * *